United States Patent
George et al.

[11] Patent Number: 6,152,148
[45] Date of Patent: Nov. 28, 2000

[54] METHOD FOR CLEANING SEMICONDUCTOR WAFERS CONTAINING DIELECTRIC FILMS

[75] Inventors: Anna M. George, Sunnyvale; Daniel L. Towery, Santa Clara, both of Calif.

[73] Assignee: Honeywell, Inc., Sunnyvale, Calif.

[21] Appl. No.: 09/145,921

[22] Filed: Sep. 3, 1998

[51] Int. Cl.[7] ..................................................... C23G 1/14
[52] U.S. Cl. .................. 134/2; 134/6; 134/25.4; 134/26; 134/29; 134/34; 134/36; 134/42; 134/902; 438/217; 438/692; 510/175; 510/176; 510/433; 510/504
[58] Field of Search ............................ 134/2, 29, 6, 25.4, 134/26, 34, 36, 42, 902; 204/180.7; 8/137; 510/175, 176, 433, 504; 438/217, 692

[56] References Cited

U.S. PATENT DOCUMENTS

| | | | |
|---|---|---|---|
| 4,050,954 | 9/1977 | Basi | 134/2 |
| 4,952,293 | 8/1990 | Sypula et al. | 204/180.7 |
| 5,049,200 | 9/1991 | Brunner et al. | 134/2 |
| 5,078,801 | 1/1992 | Malik | 134/29 |
| 5,167,667 | 12/1992 | Prigge et al. | 8/137 |
| 5,704,987 | 1/1998 | Huynh et al. | 134/6 |

OTHER PUBLICATIONS

3M, Flored Fluorosurfactants 3M Experience, pp. 1–2, Internet, Nov. 16, 1998.

*Primary Examiner*—S. Carrillo
*Attorney, Agent, or Firm*—Leslie Weise

[57] ABSTRACT

A method for cleaning the surface of a semiconductor wafer having an organic dielectric film thereon by removing residual slurry particles adhered to the wafer surface after chemical-mechanical planarization is provided. The semiconductor is subjected to a post CMP cleaning step by applying mechanical frictional force to the surface of the wafer while concurrently applying to the wafer surface and aqueous solution having a pH of greater than 10 for a period of time sufficient to wet and clean the wafer surface, the basic aqueous solution comprised of a surfactant and a tetra alkyl quaternary ammonium hydroxide compound such as tetramethylammonium hydroxide.

2 Claims, 1 Drawing Sheet

METHOD FOR CLEANING SEMICONDUCTOR WAFERS CONTAINING DIELECTRIC FILMS

TECHNICAL FIELD OF THE INVENTION

The present invention relates to a method for cleaning the surface of a semiconductor wafer containing an organic dielectric film, and more particularly, to a method for removing residual slurry particles from this wafer surface after chemical-mechanical polishing.

BACKGROUND OF THE INVENTION

Since the advent of multiple-layer metallization as an interconnect scheme for integrated circuits, there has been widespread technological focus and development efforts around deposition and characterization of reliable intermetal dielectric layers. As the dimensions of the interconnect architecture undergo progressive shrinkage, the use of organic polymer dielectrics to reduce capacitance, power consumption, and cross noise becomes all important. Functional and reliable integrated circuits require that throughout the fabrication sequence, hydrocarbon, ionic, and particulate contamination be held to a minimum. Current design schemes incorporate multi-layer circuit elements with densely packed, individual metal conductors encapsulated in dielectric materials. The metal conductors, or "lines", are often spaced less than 1Jm apart and are isolated by the dielectric, which is an effective insulator. During high temperature processing of a given layer, ionic contamination residing on the dielectric surface can diffuse into the bulk and destroy its integrity as an insulator. Sub-micron particles, if not removed, can create electrical shorts between adjacent metal lines and destroy the entire circuit. Also, contaminants adversely affect adhesion of further deposited films, mask semiconductor surfaces from reactive plasmas and chemistries necessary for further processing, and interfere with photolithography. Hence, precision cleaning methods are required throughout the IC fabrication sequence.

Organic polymers, specifically polyimides, have been used as integrated circuit intermetal dielectric materials (known as low κ dielectric materials) since the early 1970s. Aromatic polyethers, such as poly(arylene ethers) are known to exhibit thermal stability comparable to polyimides but have ten to forty times lower moisture absorption, dielectric constants in the range of 2.35 to 2.80, and good retention of storage modulus above their glass transition temperature. These properties are relevant to enhanced circuit performance (higher speed, lower power consumption, and reduced signal to noise ratios), and processing cost (high throughput and simple methodologies). Given the current cost and complexity concerns regarding plasma chemical vapor deposition of dielectrics, the replacement of expensive plasma deposition equipment and complicated plasma processed, stacked dielectric sandwiches with a spin-on coating of low dielectric organic polymer dielectric films directly onto wafer substrates offers an attractive alternative. In particular, poly(arylene ether) polymers offer lower dielectric constants which render these compounds compatible with new sub micron geometries in semiconductor substrates.

In U.S. patent application Ser. No. 08/990,157 filed on Dec. 12, 1997 and owned by the instant assignee, there is disclosed a distinctive group of poly(arylene ethers), sold under the trademark FLARE™ which represents a new promising class of intermetal dielectrics for applications in submicron multilevel interconnects. Formulated with extremely low levels of metallic contamination in low toxicity organic solvents, FLARE solutions exhibit excellent shelf life and have very low moisture absorption. When spin coated onto metal or dielectric layers, such as titanium nitride or silicon dioxide, an extremely thin uniform film is adherently coated onto the metal or dielectric layer.

In the manufacture or integrated circuits, semiconductor wafer surface planarity is of extreme importance. To achieve the degree of planarity required to produce ultra high density integrated, chemical-mechanical polishing/planarization (CMP) is often employed. The terms "planarization" and "polishing" as used herein are interchangeable when referring to the technique of "CMP". In general, CMP involves holding a semiconductor against a moving polishing surface that is wetted with a chemically reactive slurry, containing abrasive materials such as silica or alumina. For example, a slurry tailored for silicon dioxide CMP is typically comprised of a colloidal suspension of silica particles in a KOH-based solution. The polishing surface is generally a planar pad made of relatively soft, porous material such as blown polyurethane and is usually mounted on a planar platen. One disadvantage of CMP is the high defect level observed on wafers after CMP processing. These defects on the semiconductor wafer typically correspond to submicron oxide (e.g. $SiO_2$ or $Al_2O_3$) particles from the polishing slurry that remains on the wafer surface after polishing. A primary concern with the use of CMP is the efficient and complete removal of the polishing slurry to prevent problems in subsequent processing steps.

After CMP, a water rinse and some form of mechanical agitation of the wafer surface is typically employed to remove slurry chemical and abrasive residue from the surface of the semiconductor wafer. Particle removal is greatly enhanced by the addition of mechanical shear forces and consequently mechanical brush scrubbing is now widely used as a means of post-CMP cleaning.

To aid particle removal in the post CMP mechanical process, process chemistry is typically employed in the form of highly basic (high pH) aqueous solutions introduced onto the mechanical brushes of the post-CMP clean. The solution reagents are typically water soluble amines or ammonia ($NH_4OH$). However such reagents have been found either ineffective or destructive when used to post-CMP clean organic dielectric films, particularly poly(arylene ether) dielectric films. These prior art amine or ammoniated reagents cause disruption of the organic coating adhesion and delamination of the dielectric organic polymer film layer from the underlying metal or dielectric substrate layer of the semiconductor wafer. Additionally, the low κ organic polymeric dielectric layers have high surface tension properties such that the aqueous post-CMP clean solutions fail to wet (bead) the dielectric surface during mechanical brush cleaning thereby diminishing the effectiveness of the post-CMP clean.

SUMMARY OF THE INVENTION

The discovery of the present invention is that certain substituted quaternary ammonium ionic species are compatible and effective in the washing and cleaning of semiconductor wafer substrate surfaces having dielectric film coatings. Specifically, it has been found that tetra organo substituted ammonium ionic species are compatible in post CMP cleaning with dielectric film containing semiconductor substrates. More precisely, it has been discovered that tetra-alkyl substituted quaternary ammonium hydroxide ionic species characterized by the formula:

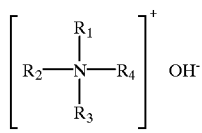

where $R_1$, $R_2$, $R_3$, and $R_4$ are each an independent substituted or unsubstituted alkyl group, are effective in the washing and cleaning of semiconductor wafers containing dielectric film coatings without delamination of these films. The quaternary ammonium compounds of the present invention are particularly useful in the post CMP particle removal cleaning of these organically coated semiconductor elements.

The present invention is a new and improved method for removing submicronic residual slurry particles from semiconductor wafer surfaces having a organic dielectric film coated on or in the semiconductor wafer structure, which method is primarily useful as an after CMP technique. CMP cleaning methods employ mechanical or frictional agitation of the wafer surface which can include a polishing, buffing, sonically vibrating, or brushing step employing the unique aqueous cleaning solutions of the instant invention. These cleaning solutions are comprised of certain tetra organo quaternary ammonium ionic species which are applied to semiconductor substrate elements having surface films of low κ organic materials. The skill and novelty in formulating this post CMP cleaning or washing step resides in finding the specific chemical formulation of the cleaning solutions and the relative concentration of each component of the recipe, and in the discovery of the particular mechanical or frictional application of these cleaning solutions to low κ organic film coated semiconductor wafers for effective cleaning. Superior results have been found with application of the present post CMP cleaning treatment to semiconductor wafers coated with low κ poly(arylene ether) films.

Briefly, the present method comprises a post CMP cleaning of a semiconductor wafer by mechanically or frictionally engaging the surface of a semiconductor substrate having a low κ organic material film coating, simultaneously with the application of a basic aqueous rinsing solution comprising a tetra-alkyl substituted quaternary ammonium hydroxide and a surfactant. In particular, the cleaning step comprises buffing, brushing or agitating the surface of a organic film containing semiconductor substrate with a cleaning means while applying a basic aqueous solution having a pH greater than 10 and comprised of (1) from about to about 1 ppm to about 10,000 ppm of a surfactant and (2) from about 0.01 to about 5.0% by weight of a tetra alkyl quaternary ammonium hydroxide characterized by the formula

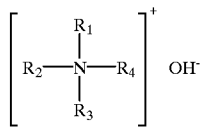

where $R_1$, $R_2$, $R_3$, and $R_4$ are each independently substituted or unsubstituted alkyl groups containing from 1 to 10 carbon atoms.

In one embodiment, the quaternary ammonium hydroxide is present in the cleaning solution in amount of about 1% by weight and comprises tetramethylammonium hydroxide ("TMAH"), wherein $R_1$, $R_2$, $R_3$, and $R_4$ are all methyl groups. The chosen surfactant is a fluorinated surfactant (fluorosurfactant) and is optimally present in the basic aqueous solution at a level of about 1 to 100 ppm. Effective surfactants are fluorinated oligomers characterized by the formula:

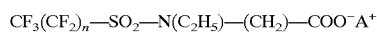

where n=1–10 and of this group those fluorosurfactants manufactured and sold by 3M Corporation under the trademark Fluorad are particularly effective.

The present invention provides a practical and efficient method for removing submicron residual slurry particles from the surface of semiconductor substrates having dielectric film material coated or contained therein after the wafer substrate has initially undergone CMP planarization. In addition, the instant post CMP wafer cleaning method encompasses numerous advantages over prior art processes for cleaning organic film coated semiconductor wafer surfaces. The low κ organic film material, on or in the wafer, remains firmly adhered to the underlying substrate surface to which the organic film material is coated or affixed; that is, no delamination takes place as was commonly the case in post CMP cleaning with other prior art basic aqueous reagents. It has been found particularly effective with low κ dielectric poly(arylene ether) film coatings on semiconductor substrates. Additionally, residual slurry particles smaller in than 0.30 μm can be removed by the present process in a commercially acceptable amount of time (typically much less than 1 minute/wafer) to provide a smooth, undisrupted, uniform wafer surface having a defect level that is satisfactory for subsequent semiconductor wafer processing steps with no delamination of the organic film coating on, or in, the wafer. This results in increased efficiency and manufacturing productivity.

In addition, the present method is advantageous because it unexpectedly provides control and predictability over the stability of organic dielectric film containing wafers as well as the number of particles remaining on the wafer surface after cleaning. Therefore manufacturing costs can be estimated with more accuracy.

The foregoing and other features of the present invention will become apparent from the following more detailed description of the drawings and the invention.

DETAILED DESCRIPTION OF THE INVENTION

Figure 1:
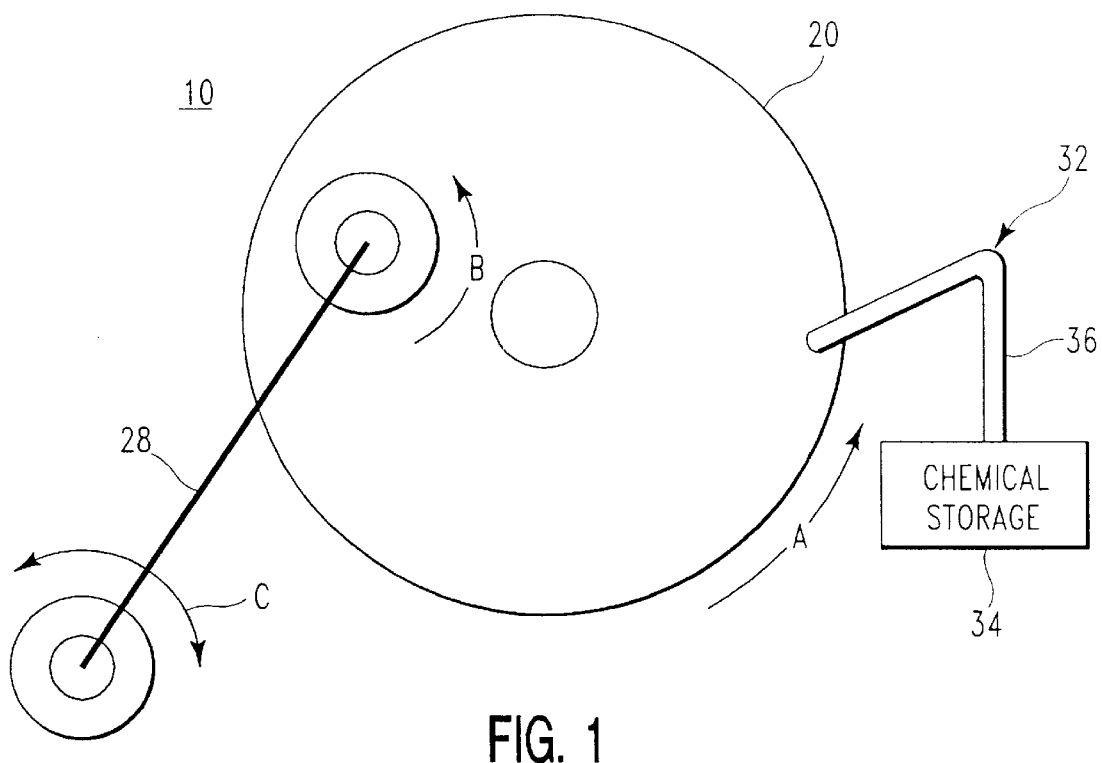
FIG. 1 is a top view of a portion of a simplified wafer polisher or chemical-mechanical planarizer.
Figure 2:
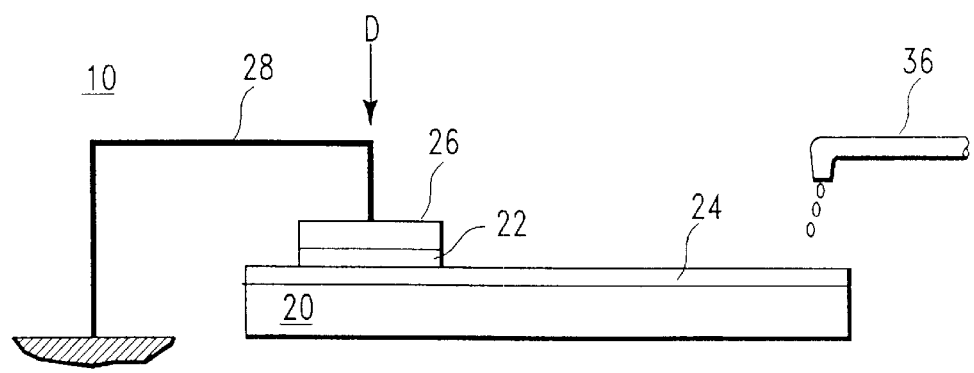
FIG. 2 is a side view of the wafer polisher of FIG. 1.

FIGS. 1 and 2 are top and side diagrammatical illustrations of a chemical mechanical polishing device 10 for planarizing semiconductor wafers employing the method of the present invention. In the form shown, the CMP tool 10 includes a chemical supply system 32 for introducing a chemical slurry containing silica or alumina to facilitate the polishing of a semiconductor wafer. Chemical supply system 32 includes a chemical storage 34 for storing slurry and a conduit 36 for transferring the slurry from chemical storage 34 to the planarization environment atop rotatable platen 20 and onto polishing pad 24 as illustratively demonstrated in FIG. 2.

Rotatable platen 20 is rotated counterclockwise about a central axis as indicated by arrow A by a motor or drive means (not shown). Semiconductor wafer 22 is pressed against slurry containing polishing pad 24 by plate 26 also rotating counterclockwise as indicated by arrow B. Plate 26 and oscillating carrier 28 hold wafer 22 against the polishing pad 24. Carrier 28 oscillates as shown in FIG. 1 by arrow C. A downward force is applied to wafer 22 as shown by arrow D. It is the CMP process represented by this diagrammatic illustration in FIGS. 1 and 2 that is necessary for critical planarization results necessary in present wafer fabrication environments but which results in the undesirable after effects of slurry particle residuals which are contaminants on planarized semiconductors.

In accordance with the cleaning process of the present invention, typically after CMP, a semiconductor wafer containing a lowκ polymeric film coating is subjected to a cleaning step using a basic aqueous solution comprised of a surfactant and a certain group of tetra alkyl quaternary ammonium hydroxides. The cleaning step of the instant method includes mechanical or frictional agitation applied to the semiconductor substrate surface to remove the slurry particles that remain adhered to the surface of the semiconductor wafer after an earlier CMP process on the substrate. An aqueous solution having a pH greater than 10, is applied to the surface of the semiconductor substrate during the cleaning step. In one embodiment, the semiconductor wafer is subjected to a post CMP mechanical brush scrubbing cleaning step applied to the semiconductor substrate surface by rotating brush rollers. In one embodiment, the aqueous cleaning solution of the present invention comprises between about 1 ppm to 10,000 ppm of a surfactant and between about 0.01 to about 5% by weight of tetra alkyl quaternary ammonium hydroxide compounds.

The addition of the surfactant changes the wettability of the polished wafer surface and its surrounding slurry particle/pad debris environment. Surfactants are used in a variety of industrial applications, including precision cleaning processes, and aid in cleaning because of their ability to adsorb onto a variety of surfaces, promote wetting through surface tension reduction, aid in solubilization or dispersement of organic and inorganic contaminants. The general architecture of a surfactant molecule comprises a hydrophilic head portion and a hydrophobic tail portion as in the case of classical organic soaps. Because of their chemical structure, surfactant molecules can attach to hydrophilic or hydrophobic surfaces. Surfactants used in the purview of the present invention can be ionic, or non-ionic, in character, the former group consisting of anionic and cationic surfactants. Reduction in liquid surface tension also is beneficial for particle removal. The surface must be "wetted" by the cleaning solution to facilitate cleaning. Normally DI water at room temperature has a surface tension of 72 dynes/cm. Appropriate surfactants reduce this value to less than 30 dynes/cm. The effect of lowering surface tension is to reduce the energy required to remove particles from surfaces. It is believed that for the case of post CMP processing of patterned wafers having low κ dielectric film insulator portions, the surfactant functions as expected and converts the hydrophobic surface of the organic film layer portion of the polished wafer to a hydrophilic state.

The improved wetting characteristics realized by incorporating surfactants into cleaning chemistries is of particular importance when cleaning surfaces with low surface energies such as organic coating surfaces which are included as part of the organic dielectric low κ film containing semiconductor substrates contemplated for processing in the instant post CMP cleaning method. Suitable surfactants for use in the present process invention adsorb onto an organic surface and allow the cleaning chemistry to wet the surface, thereby facilitating particle removal. Accordingly, any ionic or non-ionic surfactants can be use in the present post CMP semiconductor substrate cleaning process. An example of a non ionic surfactant is an alkylphenoxypolyethoxyethanol based polymers available from a number of manufacturers, examples being nonylphenoxypolyethoxy-ethanol available from GAF Corp. under the trademark ICEPAL® and octylphenoxypoly-ethoxyethanol available from UNION CARBIDE as TRITON®.

Ionic surfactants can also be employed in the process of the present invention. In the case of semiconductor substrates having low κ dielectric poly(arylene ether) film coatings, fluorinated surfactants known as fluorosurfactants are preferred materials. These surfactants are optimally present in the basic aqueous solution at level of about 1 to 100 ppm. Particularly effective fluorosurfactants are fluorinated oligomers character-ized by the formula:

where n=1–10 and of this group those fluorosurfactants manufactured and sold under the trademark FLUORAD™ by 3M company of St. Paul, Minn. have been found to be particularly effective in the process of the present invention.

At concentrations of from about 1.00 to about 10,000 ppm, a surfactant used in the present post CMP process lowers the surface tension of a TMAH solution by a factor greater than 3 (from about 78 to about 20 dynes/cm) and catalyzes a reaction to drive the unwanted post CMP oxide particles into the aqueous solution, yielding a cleaner polished wafer surface. For optimum cleaning of semiconductor substrates having low κ dielectric poly(arylene ether) film coatings, ionic polymer fluorosurfactants are employed and are present at a concentration of about 1 to 200 ppm in the aqueous cleaning solution of the present invention, and more preferably present at a concentration of about 100 ppm.

A second factor which may contribute to the adherence of slurry particles to the wafer surface is believed by Applicants to be electrostatic in nature. All particulate matter develops an electrically charged thin layer when suspended in a liquid solution. This charge is manifested as a potential known as the zeta potential which appears at the outer surface of the particle such that the particle is surrounded by a small charge field. Without being limited to any particular theory, Applicants believe that placing the abrasive particles resulting from CMP in a basic aqueous solution having a pH of 10 or more results in a negative zeta potential on the post CMP residual oxide particles. In addition, the zeta potential of many other particles present, as well as that of the surfaces contacted by the solution, is negative at this pH of greater than 10. The post CMP residual oxide particles are thus electrostatically repelled from the semiconductor wafer facilitating the removal of the slurry residue from the wafer surface. For sufficient particle removal, the pH of the solution should be adjusted to a value preferably greater than 10, with optimum results being obtained at a pH of 11.

The pH is adjusted using a quaternary ammonium hydroxide solution wherein the hydroxide is typically present between about 0.1% and 2% by weight. The quaternary ammonium hydroxide acts as a cationic surfactant and is characterized by the formula:

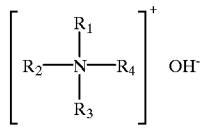

where $R_1$, $R_2$, $R_3$, and $R_4$ are each independently alkyl groups containing from 1 to 10 carbon atoms. As indicated, the present method is directed to semiconductor wafers having low κ dielectric film coatings and the use of certain tetra alkyl quaternary ammonium hydroxide compounds that are compatible with these dielectric films in that the base compounds do not reduce the adhesion of, or delaminate, these organic dielectric films from their underlying substrate supports. These tetra alkyl quaternary ammonium hydroxide compounds yield an unexpected result of compatibility because it is known that ammonium hydroxide and other hydrogen substituted amine compounds do in fact delaminate organic low κ dielectric films from their underlying semiconductor substrate supports. This has been a particularly vexing problem in the case of semiconductor substrates having low κ dielectric poly(arylene ether) film coatings.

Examples of compatible tetra alkyl quaternary ammonium hydroxides in the instant process include trimethyl-1-hydroxyethyl ammonium hydroxide, tetramethylammonium hydroxide (TMAH), tetraethylammonium hydroxide, tetrapropylammonium hydroxide, and tetrabutylammonium hydroxide. Preferably, a solution of about 2% by weight TMAH is used in the system to provide a pH greater than 10. Tetramethylammonium hydroxide is available commercially from Aldrich (USA) as a 10% by weight aqueous solution which can be diluted with water to produce a solution having the desired concentration.

As an example of the unexpected compatibility of the present quaternary ammonium compounds with low κ dielectric film coatings on or in semiconductor substrates, the following is a comparison of the low κ dielectric poly(arylene ether) polymeric film (sold under the trademark FLARE by AlliedSignal Corp.) coatings washed with TMAH and $NH_4OH$ and any demonstrated delamination or supporting substrate adhesion disruption of the organic film from the TEOS based silicon dioxide substrate.

FLARE 2.0 on a TEOS based $SiO_2$ substrate: The FLARE was spun on the substrate at ~2000 rpm, baked for two minutes at 180° C., and cured for one hour at 425° C. After cure, the wafers were allowed to cool to 300° C. prior to removal from the furnace and then stored in a wafer box with desiccant. Approximately 1.5"×5" samples were cleaved for exposure to the solutions listed in the table.

The tape test in the last column of the table was performed as follows: a piece of scotch tape was placed across the sample, pressed down with a fingernail to make a good contact, and then rapidly pulled off with the angle between the surface of the film and the tape being pulled off close to 180°. The sample was considered to pass if all of the film remained attached to the substrate, with failure occurring if some or all of the film came off with the tape.

| Date | solvent | time | temperature | film appearance after exposure | tape test after exposure |
|---|---|---|---|---|---|
| 4/17/98 | 1.6% TMAH in water | 1 minute | 25° C. | intact | pass |
| 4/17/98 | 1.6% TMAH in water | 3 minutes | 25° C. | intact | pass |
| 4/17/98 | 1.6% TMAH in water | 5 minutes | 25° C. | intact | pass |
| 4/24/98 | 1.6% TMAH in water (repeat) | 5 minutes | 25° C. | intact | pass |
| 4/24/98 | 1.6% TMAH in water | 30 minutes | 25° C. | intact | pass |
| 4/17/98 | 1.6% $NH_4OH$ in water | 1 minute | 25° C. | intact | fail |
| 4/17/98 | 1.6% $NH_4OH$ in water | 3 minutes | 25° C. | 40% intact | fail |
| 4/17/98 | 1.6% $NH_4OH$ in water | 5 minutes | 25° C. | no film remains | — |
| 4/24/98 | 1.6% $NH_4OH$ in water (repeat) | 5 minutes | 25° C. | <10% intact | fail |

While not to be construed as limiting, the delamination observed for $NH_4OH$ is believed to be caused at least in part by the presence of the direct N—H bonds in ammonium hydroxide. It is theorized that this bond interacts with the underlying substrate surface ($SiO_2$ derived from TEOS in this case) fairly strongly, effectively outcompeting the low κ dielectric FLARE material for the available bonding sites thereby reducing complete adhesion of the dielectric film to the underlying $SiO_2$ layer. It is expected that at concentration levels of less than 5%, and preferably less than 3%, other completely tetra alkyl substituted quaternary ammonium salts containing organic groups rather than a hydrogen (H) atom bonded directly to the nitrogen (N) atom will also not lead to delamination of the dielectric FLARE film from silicate and silicon nitride substrates.

Tests with a variety of amine and amide based solvents indicate that solvents most likely to cause delamination are the strongly basic amines that contain N—H bonds. For example, monoethanolamine (a primary amine) and 2-methylaminoethanol (a secondary amine), both cause delamination while dimethylacetamide does not.

As indicated, the present cleaning method includes the step of frictionally or mechanically agitating the surface or semiconductor wafer having a low κ dielectric film coated therein or thereon. By frictional or mechanical agitation of the semiconductor substrate surface is meant buffing, rubbing, brushing or sonically vibrating the surface of the semiconductor wafer. Particle removal is further enhanced by the addition of mechanical shear forces. Consequently mechanical brush scrubbing is now widely used as a means of post-CMP cleaning and is the preferred mechanical agitation application to effect semiconductor wafer cleaning in accordance with the instant invention. In practice the mechanical scrubbing occurs on both sides of the wafer (backside and surface) simultaneously and is thus referred to as double-sided brush scrubbing.

The present cleaning process can be performed in a double-sided mechanical brush scrubber, such as those manufactured by OnTrak Systems of Milpitas, Calif. In a typical double-sided brush scrubbing processes the wafer contacts, and rotates between permeable, cylindrical rollers, or "brushes" that are preferably comprised of a compliant material. The relative motion of the wafer with respect to the brushes, along with contact force generated by the brushes, directs energy in the form of mechanical work to the wafer surface. The instant aqueous-based process chemistry is concurrently introduced onto the permeable, sponge-like brushes and applied to the wafer. The combined chemical and mechanical action removes particles from the wafer surface and flushes the particles away from the wafer-brush interface. The process chemistry is typically a high pH aqueous solution based on amine compounds, such as $NH_4OH$. The high pH induces a negative zeta potential on most surfaces, including the brushes, contaminant particles and the semiconductor surface. The high zeta potential aids in particle removal from and hinders particle re-deposition to the semiconductor wafer surface.

Currently polyvinyl alcohol, or PVA, is the material of choice for brushes in brush scrubbing devices. PVA is compliant, and therefore will not scratch the wafer surface. It is also permeable and chemically robust in a variety of extreme pH media, thus it is compatible with a wide array of cleaning solutions including the solutions used in the present process. In practice, the result of the instant post CMP cleaning process is a nearly particle free semiconductor wafer surface. The post CMP cleaning chemistry offered by the present invention is simultaneously compatible with most cleaning equipment and semiconductor wafer materials, particularly those which includes a low κ dielectric film material. The typical post-CMP brush scrubbing processes is approximately 1 minute in duration and incorporates two sequential brush-stations.

Having thus described the principles of the invention, together with illustrative embodiments thereof, it is to be understood that the purview of invention goes well beyond the instant description. Although specific terms of description are employed, they are used in a generic and descriptive sense and not for the purpose of limitation. For example, while the present process is described in terms of a post CMP clean, it is well understood by those skilled in the art that the disclosed cleaning steps can be applied to any cleaning of organic low κ film containing semiconductor substrates. Accordingly, the scope of the invention is set forth in the instant claims.

What is claimed is:

1. A method of cleaning a semiconductor wafer surface previously subjected to a chemical mechanical planarization treatment comprising:

a) providing a semiconductor wafer surface having a poly(arylene ether) dielectric film coating and residual particles thereon remaining after the chemical mechanical planarization treatment; and b) applying mechanical and frictional agitation to the semiconductor wafer surface while concurrently applying to the semiconductor wafer surface an aqueous solution having a pH of greater than 10 for a period of time sufficient to wet and clean the semiconductor wafer surface, said aqueous solution comprising about 1.00 to 10,000 ppm of a surfactant and 0.01 to 5% by weight of a tetra alkyl quarternary ammonium hydroxide compound selected from the group consisting of trimethyl-1-hydroxyethyl ammonium hydroxide, tetramethylammonium hydroxide (TMAH), tetraethylammonium hydroxide, tetrapropylammonium hydroxide, and tetra-butylammonium hydroxide, wherein said aqueous solution cleans the semiconductor wafer surface by removing the residual particles from the semiconductor wafer surface without delaminating the poly (arylene ether) dielectric film coating present on the semiconductor wafer surface.

2. The method of claim 1, wherein the tetra alkyl quarternary ammonium hydroxide compound is present at a level of less than 3% by weight.

* * * * *